United States Patent
Lv

(10) Patent No.: US 9,536,902 B2
(45) Date of Patent: Jan. 3, 2017

(54) METHOD OF FABRICATING A THIN FILM TRANSISTOR SUBSTRATE USING A PLURALITY OF PHOTO MASKS AND LIQUID CRYSTAL DISPLAY

(71) Applicant: Shenzhen China Star Optoelectronics Technology Co., Ltd., Shenzhen, Guangdong (CN)

(72) Inventor: Qibiao Lv, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 57 days.

(21) Appl. No.: 14/401,105

(22) PCT Filed: Oct. 10, 2014

(86) PCT No.: PCT/CN2014/088305
§ 371 (c)(1),
(2) Date: Nov. 13, 2014

(87) PCT Pub. No.: WO2016/037391
PCT Pub. Date: Mar. 17, 2016

(65) Prior Publication Data
US 2016/0079284 A1 Mar. 17, 2016

(30) Foreign Application Priority Data
Sep. 12, 2014 (CN) .......................... 2014 1 0466954

(51) Int. Cl.
*H01L 27/12* (2006.01)
*H01L 29/786* (2006.01)
(Continued)

(52) U.S. Cl.
CPC ..... *H01L 27/1222* (2013.01); *G02F 1/136227* (2013.01); *H01L 27/124* (2013.01);
(Continued)

(58) Field of Classification Search
CPC ............. H01L 27/1222; H01L 27/1259; H01L 29/78669
See application file for complete search history.

(56) References Cited

U.S. PATENT DOCUMENTS

2008/0239215 A1* 10/2008 Chae ................. G02F 1/134363
349/107
2010/0053507 A1* 3/2010 Song ................. G02F 1/136209
349/84

(Continued)

*Primary Examiner* — Paul Lee
(74) *Attorney, Agent, or Firm* — Andrew C. Cheng

(57) ABSTRACT

A thin film transistor array substrate includes a pixel electrode layout area, a data electrode layout area, a transparent pixel electrode layer formed in the pixel electrode layout area, a first metal layer, a first dielectric layer, an amorphous silicon layer, a second metal layer, a second dielectric layer formed in the pixel electrode layout area and the data electrode layout area. The first dielectric layer covers the first metal layer. The amorphous silicon layer, the second metal layer and the second dielectric layer are sequentially formed on the first dielectric layer. The transparent pixel electrode layer is connected to the second metal layer through a via hole formed in the pixel electrode area of the second dielectric layer. Moreover, a method for manufacturing the thin film transistor array and a liquid crystal display including the thin film transistor array substrate also are provided.

4 Claims, 4 Drawing Sheets

(51) Int. Cl.
*H01L 29/66* (2006.01)
*G02F 1/1362* (2006.01)

(52) U.S. Cl.
CPC .... *H01L 27/1259* (2013.01); *H01L 29/66765* (2013.01); *H01L 29/78669* (2013.01)

(56) References Cited

U.S. PATENT DOCUMENTS

2011/0069265 A1\* 3/2011 Kim .................. G02F 1/136204
  349/122
2012/0081640 A1\* 4/2012 Kim .................. G02F 1/133514
  349/106

\* cited by examiner

METHOD OF FABRICATING A THIN FILM TRANSISTOR SUBSTRATE USING A PLURALITY OF PHOTO MASKS AND LIQUID CRYSTAL DISPLAY

TECHNICAL FIELD

The present invention relates to liquid crystal display technology, and more particularly to a thin film transistor array substrate and fabricating method thereof, and a liquid crystal display.

BACKGROUND

With the development of information society, demand for flat display has been grown rapidly. Liquid crystal displays (LCDs) have advantages of small size, low energy consumption, and no radiation, and thus LCDs dominate the flat display market. However, the competition between LCD manufacturers is also huge. Thus, how to improve the display quality, reduce the defect product ratio, and reduce the manufacturing cost becomes the important guarantee to survive in the fierce competition. LCDs usually employ thin film transistors as the driver to achieve high speed, high brightness and high contrast ratio display effect.

Generally, the mainstream processes of manufacturing thin film transistors of bottom gate type may include four masks lithography process (4 Masks) or five masks lithography process (5 Masks). The "5 Masks" process includes a lithography process for forming gate electrodes (using a gate mask), a lithography process for forming the active layer (using an active mask), a lithography process for forming the source/drain electrodes (with a S/D mask), a lithography process for forming the via holes (using a via hole mask), and a lithography process for forming the pixel electrodes with a pixel mask). Each lithography process includes a thin film deposition process, an etching (including dry etching or wet etching) process, and a stripping process. Thus, to finish the "5 Masks" process, a process including the following sub-processes: thin film deposition process, photo-etching process, developing process, and stripping process, is looped 5 times.

The "4 Masks" process is developed by modifying the "5 Masks" process. The active mask and the S/D mask can be merged into a same mask by using gray tone photo-etching (using a gray tone mask), half tone photo-etching (using a half tone mask), or single slit mask process (using a single slit mask). That is, one mask could achieve the same etching result as the active mask and the S/D mask by adjusting the etching process.

FIG. 1 is a front schematic view of a thin film transistor array substrate manufactured using the known 4 masks process. FIG. 2 is a cross sectional schematic view taken along a line A-A in FIG. 1. Referring to FIGS. 1 and 2, a thin film transistor array substrate 20 includes a gate layout area 20a, a data electrode layout area 20b, and a pixel electrode layout area 20c. The thin film transistor array substrate 20 includes a glass substrate 21. On the glass substrate 21, a gate metal layer 22, a gate dielectric layer 23, an active layer 24 comprised of amorphous silicon (a-Si), a source metal layer 25a and a drain metal layer 25b formed on the active layer 24, a passivation layer 26, a via hole 27 formed above the drain metal layer 25b and in the passivation layer 26, and a transparent (indium tin oxide, ITO) pixel electrode layer 28 are sequentially formed. The transparent pixel electrode layer 28 is connected to the drain metal layer 25b via the via hole 27.

The data electrode layout area 20b includes the gate dielectric layer 23, the active layer 24 comprised of amorphous silicon (a-Si), the source metal layer 25a one the active layer 24, and the passivation layer 26 sequentially formed on the glass substrate 21. The pixel electrode layout area 20c includes the gate dielectric layer 23, the active layer 24 comprised of amorphous silicon (a-Si), the source metal layer 25a one the active layer 24, the passivation layer 26, via hole 27 formed in the passivation layer 26 and the transparent pixel electrode layer 28 sequentially formed on the glass substrate 21. The transparent pixel electrode layer 28 is connected to the drain metal layer 25b via the via hole 27.

As the amorphous silicon used to form the active layer 24 is a type of semiconductor material, the active layer 24 would produce photo current under the strong light irradiated from the backlight module of LCDs, and the photo current would change the pixel driving voltage provided by the transparent pixel electrode layer 28 for the liquid pixels. Finally, abnormal display of LCDs occurs, especially, severe image sticking phenomenon easily occurs during the performance testing process.

SUMMARY

To solve the existing technical issues in the known art, an object of the present invention is to provide a thin film transistor array substrate, which includes a pixel electrode layout area and a data electrode layout area. The thin film transistor array substrate further includes a transparent pixel electrode layer formed in the pixel electrode layout area, and further includes a first metal layer, a first dielectric layer, an amorphous silicon layer, a second metal layer, a second dielectric layer formed in the pixel electrode layout are and the data electrode layout area. The first dielectric layer covers the first metal layer. The amorphous silicon layer, the second metal layer and the second dielectric layer are sequentially formed on the first dielectric layer. The transparent pixel electrode layer is connected to the second metal layer via a via hole formed in the pixel electrode area of the second dielectric layer.

In addition, the thin film transistor array substrate further includes a photoresist layer, disposed between the first dielectric layer and the amorphous layer.

In addition, the photoresist layer is a red photoresist layer, a green photoresist layer or a blue photoresist layer.

Another object of the present invention is to provide a method for manufacturing a thin film transistor array substrate. The method includes the following steps: A) forming a first metal layer in a pixel electrode layout area and a data electrode layout area using a first photo mask; B) depositing a first dielectric layer; C) forming a second metal layer on the first dielectric layer using a second photo mask; D) depositing a second dielectric layer; E) forming a via hole in a pixel electrode layout area of a second dielectric layer using a third photo mask; F) forming a transparent pixel electrode layer on the pixel electrode layout area of the second dielectric layer using a fourth photo mask, wherein the transparent pixel electrode layer is connected to the pixel electrode layout area of second metal layer via the via hole.

In addition, prior to the step C), the method further includes a step of depositing a photoresist layer on the first dielectric layer.

In addition, the photoresist layer is a red photoresist layer, a green photoresist layer or a blue photoresist layer.

Still another object of the present invention is to provide a liquid crystal display that includes the above thin film transistor array substrate.

In embodiments of the present invention, the first metal layer is formed below the amorphous silicon layer. Because the first metal layer is comprised of an opaque metal material, the first metal layer can block the intensive light beams produced by a backlight module of the LCD display, and the amorphous silicon layer is prevented from being irradiated by the intensive light beams. Thus, the amorphous silicon layer won't produce phot current, and doesn't change the pixel driving voltage provided to the transparent pixel electrode layer or produce abnormal display of the LCD. In other words, the mage sticking phenomenon doesn't occur. In addition, there is the photoresist layer formed between the first dielectric layer and the amorphous silicon layer, and the photoresist layer has a low dielectric coefficient and a big thickness. Thus, the photoresist layer increases an interval between the first metal layer and the second metal layer. The capacitance between the first metal layer and the second metal layer is significantly decreased. Therefore, insufficient recharging state or recharging error of pixels caused by the strong resistance-capacitance delay (RC delay) is avoided, and the display quality of the LCD is improved.

BRIEF DESCRIPTION OF THE DRAWINGS

Described accompanying with the following figures, the above or other aspects, characteristics, and advantages of embodiments of the present invention will become more clearly. In the figures.

DETAILED DESCRIPTION OF PREFERRED EMBODIMENTS

The embodiments of the present invention will be described with reference to the figures as follows. However, many other different manners can also be used to implement the present invention, and the present invention shouldn't be interpreted only as the described embodiments. In contrast, the embodiments are provided to explain the principles and practical applications of the present invention for enabling those ordinarily skilled in the art to understand embodiments of the present invention and made modifications to these embodiments for satisfying a particular application.

It is to be noted that, the terms "first" and "second" are used to describe various elements here. However, these elements are not limited by these terms. The terms are only used to distinguish one element from another.

Figure 1:
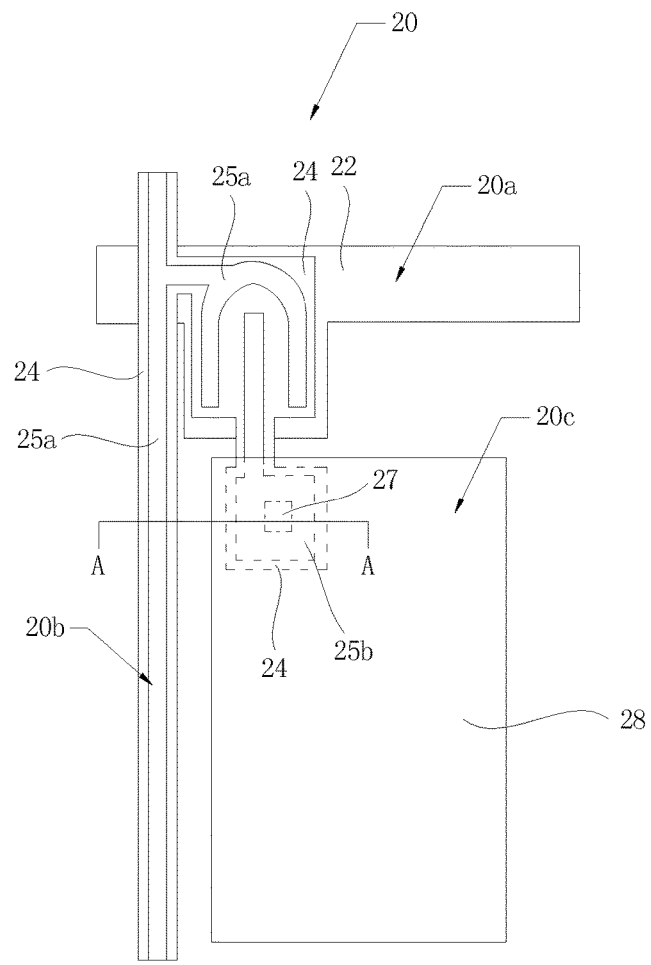
FIG. 1 is a front schematic view of a thin film transistor array substrate manufactured using the "4 masks" process in the known art.
Figure 2:
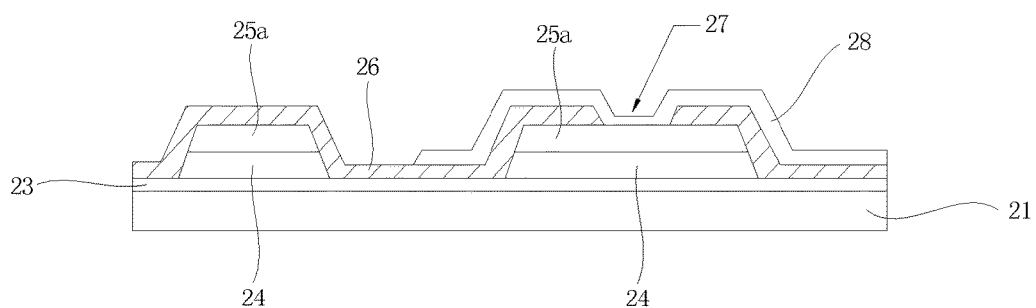
FIG. 2 is a cross sectional schematic view taken along a line A-A in FIG. 1.
Figure 3:
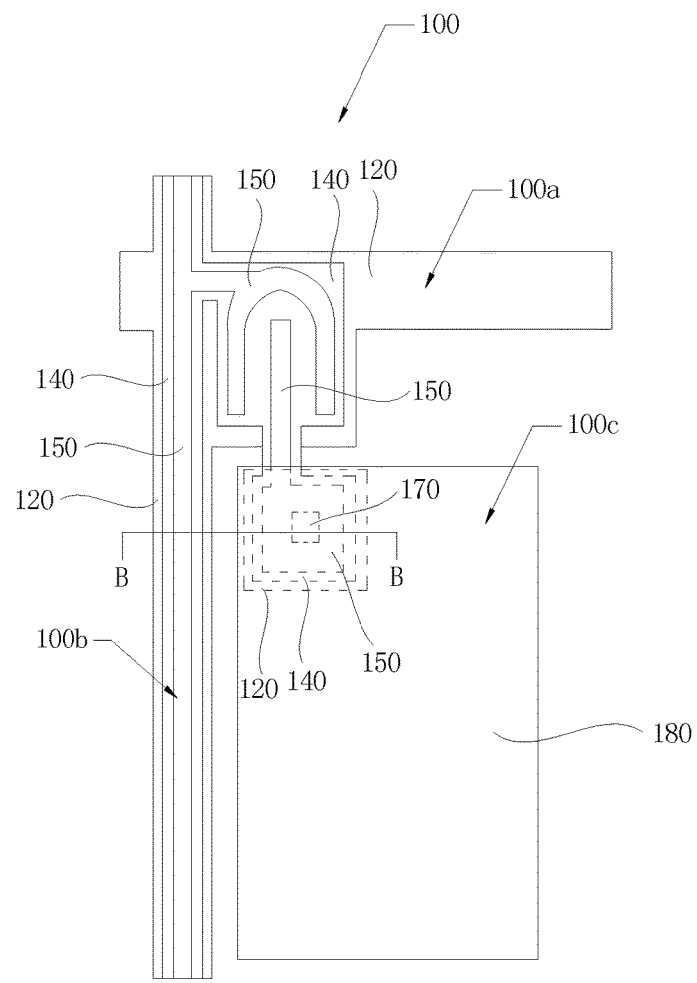
FIG. 3 is a front schematic view of a thin film transistor array substrate according to an embodiment of the present invention.
Figure 4:
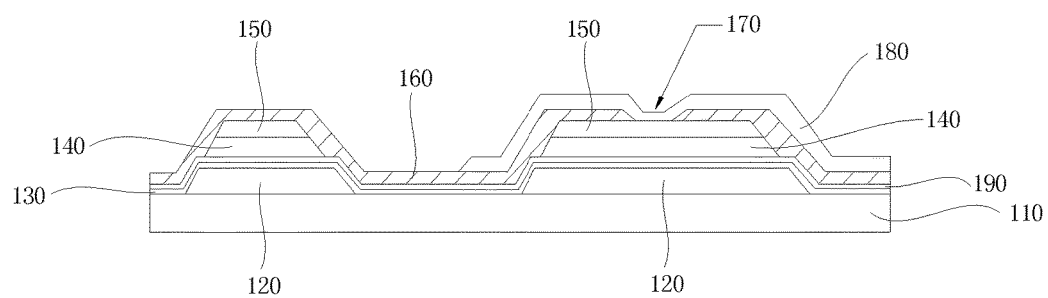
FIG. 4 is a cross sectional schematic view taken along a line B-B in FIG. 3.

FIG. 3 is a front schematic view of a thin film transistor array substrate according to an embodiment of the present invention. FIG. 4 is a cross sectional schematic view taken along a line B-B in FIG. 3.

Referring to FIGS. 3 and 4, a thin film transistor array substrate 100 provided by an embodiment of the present invention includes a gate electrode layout area 100a, a data electrode layout area 100b, and a pixel electrode layout area 100c.

The thin film transistor array substrate 100 also includes a substrate (for example, a glass substrate) 110, and a first metal layer (i.e., a gate metal layer) 120, a first dielectric layer (i.e., a gate dielectric layer) 130 covering the first metal layer 120, an amorphous layer (i.e., an active layer) 140, a second metal layer 150 covering the amorphous layer 140, a second dielectric layer (or a passivation layer) 160, a via hole 170 and a transparent pixel electrode layer (i.e., an indium tin oxide layer) 180 sequentially formed on the substrate 110 in the written order. A portion of the second metal layer 150 in the pixel electrode layout area 110c is a drain metal layer, and a portion of the second metal layer 150 in the gate layout area 100a or the data electrode layout area 100c is a source metal layer. The via hole is formed above the drain metal layer and in the second dielectric layer 160. The transparent pixel electrode layer 180 is connected to the drain metal layer via the via hole 170.

According to the present embodiment, in the gate layout area 110a, the thin film transistor array substrate 100 includes the first metal layer 120, the first dielectric layer 130, the amorphous silicon layer 140, the second metal layer 150 (that is the source metal layer on the amorphous silicon layer 140, and the second dielectric layer 160 formed on the substrate 110 in the written order. In the data electrode layout area 100b, the thin film transistor array substrate 100 includes the first metal layer 120, the first dielectric layer 130, the amorphous layer 140, the second metal layer 150 (that is the source metal layer on the amorphous silicon layer 140) and the second dielectric layer 160 formed on the substrate 110 in the written order. In the pixel electrode layout area 100c, the thin film transistor array substrate 100 includes the first metal layer 120, the first dielectric layer 130, the amorphous silicon layer 140, the second metal layer 150 (that is drain metal layer on the amorphous layer 140), the second dielectric layer 160, the via hole 170 above the drain metal layer and in the second dielectric layer and the transparent pixel electrode layer 180 formed on the substrate 110 in the written order. The transparent pixel electrode layer 180 is connected with the drain metal layer via the via hole 170.

As described above, there is the first metal layer 120 below the amorphous silicon layer 140 at each area. Because the first metal layer 120 is comprised of an opaque metal material, thus the first metal layer 120 can block the intensive light beams produced by a backlight module of the LCD display, and the amorphous silicon layer 140 is prevented from being irradiated by the intensive light beams. Thus, the amorphous silicon layer 140 won't produce phot current, and doesn't change the pixel driving voltage provided to the transparent pixel electrode layer or produce abnormal display of the LCD. In other words, the mage sticking phenomenon doesn't occur in the LCD.

In addition, the thin film transistor array substrate 100 of the present embodiment further includes the photoresist layer 190. The photoresist layer 190 is formed between the first dielectric layer 130 and the amorphous silicon layer 140. In addition, the photoresist layer 190 is formed in each area. The photoresist layer 190 has a low dielectric coefficient and a big thickness. Thus, the photoresist layer 190 increases an interval between the first metal layer 120 and the second metal layer 150. The capacitance between the first metal layer 120 and the second metal layer 150 is significantly decreased. Therefore, insufficient recharging state or recharging error of pixels caused by the strong resistance-capacitance delay (RC delay) is avoided, and the display quality of the LCD is improved. In the present embodiment, the photoresist layer 190 can be a red photoresist layer, a green photoresist layer or a blue photoresist layer.

Figure 5:
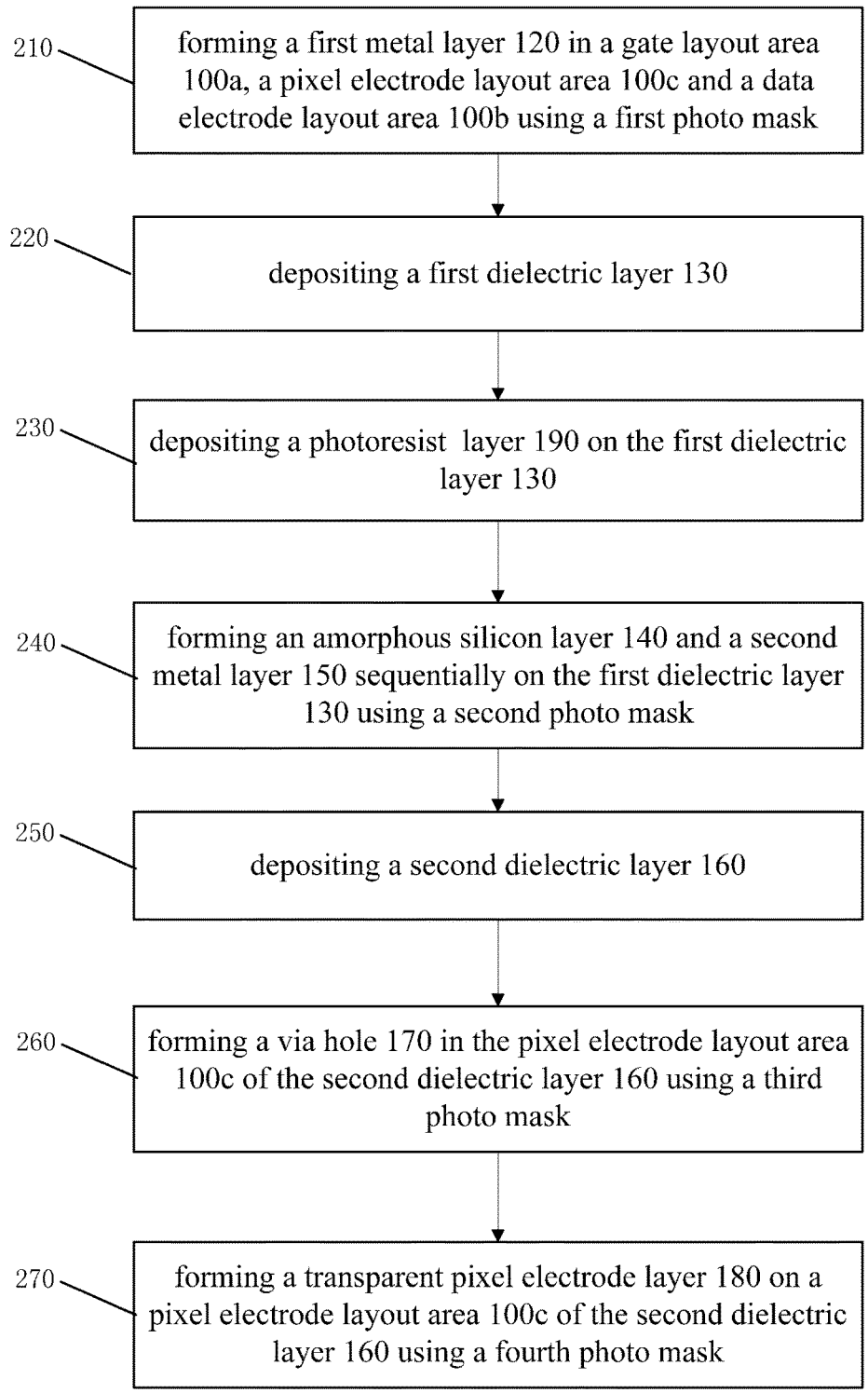
FIG. 5 is a flow chart of a method for manufacturing a thin film transistor array substrate according to an embodiment of the present invention.

A method for manufacturing a thin film transistor array substrate according to an embodiment of the present invention is described below. FIG. 5 is a flow chart of the method for manufacturing the thin film transistor array substrate according to the embodiment.

Referring to FIGS. 3 to 5, in a step 210, a first metal layer 120 is formed in a gate layout area 100a, a pixel electrode layout area 100c and a data electrode layout area 100b using a first photo mask. In the step 210, a first metal film is deposited on a substrate 110, and then the first metal film is exposed using the first photo mask, developed and the etched using a wet etching process. The first metal layer 120 is formed after stripping the photoresist on the first metal film. The first metal film can be a metal film of Ta, MoTa, MoW or Al.

B) In a step 220, a first dielectric layer 130 is deposited. Here, the first dielectric layer 130 is also referred as the gate dielectric layer, and is deposited on each area of the first meta layer 120 and the portion of the substrate 110 that is not covered by the first metal layer 120.

In a step 240, an amorphous silicon layer 140 and a second metal layer 150 are sequentially formed on the first dielectric layer 130 using a second photo mask. Here, the second metal layer 150 in the gate layout area 100a and the data electrode layout area 100b is the source metal layer, and the second metal layer 150 in the pixel electrode layout area 100c is the drain metal layer. In the step 240, an amorphous silicon layer and a second metal film are deposited on the first dielectric layer 130, and then the second metal film is exposed using the second photo mask, developed and the etched using a wet etching process and a dry etching process. The amorphous layer 140 (the active layer) and the second metal layer 150 are formed after stripping the photoresist on the second metal film.

In a step 250, a second dielectric layer 160 is deposited. Here, the second dielectric layer 160 is also referred as a passivation layer. The second dielectric layer 160 is deposited on the second metal layer 150 in all the areas, and is also deposited on portions of the first dielectric layer 130 that are not covered by the amorphous silicon layer 140 and the second metal layer 150.

In a step 260, a via hole 170 is formed in the pixel electrode layout area 100c of the second dielectric layer 160 using a third photo mask. In the step 260, the second dielectric layer 160 is exposed using the third photo mask, developed, etched using a dry etching process, and then the photoresist is stripped from the second dielectric layer 160 to form the via hole 170.

In a step 270, a transparent pixel electrode layer 180 (indium tin oxide layer) is formed on pixel electrode layout area 100c of the second dielectric layer 160 using a fourth photo mask. The transparent pixel electrode layer 180 is connected to the second metal layer 150 (i.e., the drain metal layer) via the via hole 170. In the step 270, a transparent pixel electrode film is deposited on the second dielectric layer 160. The deposited transparent pixel electrode film is exposed using the fourth photo mask, developed, etched using a wet etching process, and then the photoresist is stripped to remove portions of the transparent pixel electrode film not in the pixel electrode layout area 100c, and remain portions of the transparent pixel electrode film in the pixel electrode layout area 100c. The remained transparent pixel electrode film forms the transparent pixel electrode layer 180 in the pixel electrode layout area 100c.

Additionally, in the present embodiment, the method according to embodiment of the present invention may further include a step 230 prior to the step 240 is executed. In the step 230, the photoresist layer 190 is deposited on the first dielectric layer 130. Here, the photoresist layer 190 is deposited on the first dielectric layer 130 in all layout areas. In the present embodiment, the photoresist layer 190 may be a red photoresist layer, a green photoresist layer or a blue photoresist layer.

Figure 6:
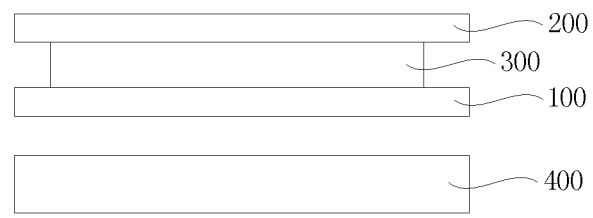
FIG. 6 is a schematic view of a liquid crystal display according to n embodiment of the present invention.

FIG. 6 is a schematic view of a LCD according to an embodiment of the present invention.

Referring to FIG. 6, the LCD of the present embodiment includes a LCD panel and a backlight module 400 disposed opposite to the LCD panel. The backlight module 400 provides light source to the LCD panel, and the LCD panel utilizes the light from the backlight module 400 to display images. The LCD panel may include the following components: the above thin film transistor array substrate 100, the second substrate 200 (i.e., a photoresist substrate) which includes a black matrix and an aligning layer, a liquid crystal layer 300 interposed between the thin film transistor array substrate 100 and the second substrate 200. The thin film transistor array substrate 100 and the second substrate 200 are arranged to be opposite to each other.

As the second substrate 200 of the present embodiment is same to that in the known art, and thus the structure of the second substrate 200 can be referred to any related art, and is not further described here. The backlight module 400 of the present embodiment can also be the known backlight module, the structure of the backlight module 400 can also referred to any related art, and is not further described here.

Although the present invention is described with the reference to the embodiments, however, those ordinarily skilled in the art would know that form or details of the embodiment may be varied without departing from the spirit and scope of the present invention that limited by the claims or their equivalents.

What is claimed is:

1. A method for manufacturing a thin film transistor array substrate, comprising:
   A) forming a first metal layer in a pixel electrode layout area and a data electrode layout area using a first photo mask;
   B) depositing a first dielectric layer;
   C) forming a second metal layer on the first dielectric layer using a second photo mask;
   D) depositing a second dielectric layer;
   E) forming a via hole in a pixel electrode layout area of a second dielectric layer using a third photo mask;
   F) forming a transparent pixel electrode layer on the pixel electrode layout area of the second dielectric layer using a fourth photo mask, wherein the transparent pixel electrode layer is connected to the pixel electrode layout area of second metal layer via the via hole;
   wherein the method further comprises a step of depositing a photoresist layer on the first dielectric layer prior to execute the step C).

2. The method of claim 1, wherein the photoresist layer is a red photoresist layer, a green photoresist layer or a blue photoresist layer.

3. A liquid crystal display, comprising a thin film transistor array substrate, a second substrate opposite to the thin film transistor array substrate, and a liquid crystal layer interposed between the thin film transistor array substrate and the second substrate;

the thin film transistor array substrate, comprising: a pixel electrode layout area and a data electrode layout area;

the thin film transistor array substrate further comprising a transparent pixel electrode layer formed in the pixel electrode layout area, and further comprising a first metal layer, a first dielectric layer, an amorphous silicon layer, a second metal layer and a second dielectric layer all formed in the pixel electrode layout are and the data electrode layout area;

the first dielectric layer covering the first metal layer;

the amorphous silicon layer, the second metal layer and the second dielectric being sequentially formed on the first dielectric layer and thereby the first dielectric layer being located between the first metal layer and the amorphous silicon layer;

the transparent pixel electrode layer being connected to the second metal layer via a via hole formed in the pixel electrode area of the second dielectric layer;

wherein the thin film transistor array substrate further comprises a photoresist layer formed between the first dielectric layer and the amorphous silicon layer and thereby the first metal layer, the first dielectric layer, the photoresist layer and the amorphous silicon layer are sequentially arranged in that order.

4. The liquid crystal display of claim 3, wherein the photoresist layer is a red photoresist layer, a green photoresist layer or a blue photoresist layer.

\* \* \* \* \*